US012389778B2

(12) United States Patent
Joo et al.

(10) Patent No.: US 12,389,778 B2
(45) Date of Patent: Aug. 12, 2025

(54) DISPLAY APPARATUS AND METHOD OF MANUFACTURING THE SAME

(71) Applicant: SAMSUNG DISPLAY CO., LTD., Yongin-si (KR)

(72) Inventors: Sunkyu Joo, Yongin-si (KR); Keunchan Oh, Yongin-si (KR); Inok Kim, Yongin-si (KR); Jangsoo Kim, Yongin-si (KR); Jaecheol Park, Yongin-si (KR); Jaemin Seong, Yongin-si (KR); Yousik Shin, Yongin-si (KR); Gakseok Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/436,012

(22) Filed: Feb. 7, 2024

(65) Prior Publication Data

US 2024/0244878 A1    Jul. 18, 2024

Related U.S. Application Data

(62) Division of application No. 17/107,618, filed on Nov. 30, 2020, now Pat. No. 11,903,237.

(30) Foreign Application Priority Data

Apr. 17, 2020 (KR) ........................ 10-2020-0046881

(51) Int. Cl.
*H10K 59/38* (2023.01)
*H10K 50/842* (2023.01)
(Continued)

(52) U.S. Cl.
CPC ......... *H10K 59/38* (2023.02); *H10K 50/8428* (2023.02); *H10K 50/865* (2023.02);
(Continued)

(58) Field of Classification Search
CPC . H01L 51/525; H01L 27/322; H01L 51/5284; H01L 51/56; H01L 27/3246;
(Continued)

(56) References Cited

U.S. PATENT DOCUMENTS

| 9,910,320 | B2 | 3/2018 | Kwak |
| 10,466,547 | B2 | 11/2019 | He |
| 10,705,271 | B2 | 7/2020 | Kim et al. |
| 2014/0346477 | A1 | 11/2014 | Chao et al. |

(Continued)

FOREIGN PATENT DOCUMENTS

| KR | 10-2014-0007530 A | 1/2014 |
| KR | 10-2017-0082696 A | 7/2017 |

(Continued)

*Primary Examiner* — Kevin Quarterman
(74) *Attorney, Agent, or Firm* — Womble Bond Dickinson (US) LLP

(57) ABSTRACT

A display apparatus, includes: a first pixel, a second pixel, and a third pixel each configured to emit different colors; an organic light-emitting diode on a substrate and including a pixel electrode, an intermediate layer, and an opposite electrode; a black matrix on the organic light-emitting diode; a column spacer on the same layer as the black matrix and spaced apart from the black matrix by a first distance in a plan view; and a first quantum conversion layer on the substrate to correspond to an emission area of the first pixel and including first quantum dots.

9 Claims, 11 Drawing Sheets

(51) Int. Cl.
*H10K 50/86* (2023.01)
*H10K 59/80* (2023.01)
*H10K 71/00* (2023.01)
*G09G 3/3233* (2016.01)
*G09G 3/3275* (2016.01)
*H10K 50/844* (2023.01)
*H10K 59/122* (2023.01)

(52) U.S. Cl.
CPC ..... *H10K 59/8723* (2023.02); *H10K 59/8792* (2023.02); *H10K 71/00* (2023.02); *G09G 3/3233* (2013.01); *G09G 3/3275* (2013.01); *H10K 50/844* (2023.02); *H10K 59/122* (2023.02)

(58) Field of Classification Search
CPC ............. H01L 51/5253; H01L 51/0024; H01L 27/3248; H01L 27/3262; H01L 27/3279; H01L 27/3211; H01L 51/5246; H01L 2227/323; G09G 3/3233; G09G 3/3275
See application file for complete search history.

(56) References Cited

U.S. PATENT DOCUMENTS

| | | |
|---|---|---|
| 2017/0168223 A1* | 6/2017 | Feng .................. G02B 6/0031 |
| 2018/0100956 A1 | 4/2018 | Lee et al. |
| 2019/0137815 A1 | 5/2019 | Kim et al. |
| 2019/0179065 A1 | 6/2019 | Kim et al. |
| 2019/0212610 A1 | 7/2019 | Kim et al. |
| 2019/0371865 A1 | 12/2019 | Lee et al. |
| 2019/0386253 A1 | 12/2019 | Li et al. |
| 2020/0110303 A1 | 4/2020 | Lee et al. |
| 2020/0119237 A1 | 4/2020 | Kim et al. |
| 2020/0136074 A1 | 4/2020 | Lee et al. |
| 2020/0161579 A1 | 5/2020 | Kim et al. |
| 2020/0217998 A1 | 7/2020 | Jung et al. |
| 2020/0258946 A1 | 8/2020 | Kim et al. |
| 2020/0295310 A1 | 9/2020 | Moon et al. |
| 2022/0085334 A1 | 3/2022 | Oh et al. |

FOREIGN PATENT DOCUMENTS

| | | |
|---|---|---|
| KR | 10-2019-0067955 A | 6/2019 |
| KR | 10-1990851 B1 | 6/2019 |
| KR | 10-2019-0137203 A | 12/2019 |

* cited by examiner

DISPLAY APPARATUS AND METHOD OF MANUFACTURING THE SAME

CROSS-REFERENCE TO RELATED APPLICATIONS

This application is a divisional of U.S. patent application Ser. No. 17/107,618, filed Nov. 30, 2020, which claims priority to and the benefit of Korean Patent Application No. 10-2020-0046881, filed Apr. 17, 2020, the entire content of both of which is incorporated herein by reference.

BACKGROUND

1. Field

Aspects of one or more embodiments relate to a display apparatus and a method of manufacturing the same.

2. Description of Related Art

A display apparatus is an apparatus that visually displays data. Such a display apparatus may include a substrate divided into a display area and a peripheral area outside a footprint of the display area. The display area may include a scan line and a data line insulated from each other and may include a plurality of pixels. Also, the display area may include a thin-film transistor corresponding to each of the pixels and a pixel electrode electrically connected to the thin-film transistor. Also, the display area may include an opposite electrode commonly provided in the pixels. The peripheral area may include various lines configured to transmit electrical signals to the display area, a scan driver, a data driver, a controller, a pad portion, and the like.

Display apparatuses have been used for various purposes. Various designs have been attempted to improve the quality of display apparatuses.

The above information disclosed in this Background section is only for enhancement of understanding of the background and therefore the information discussed in this Background section does not necessarily constitute prior art.

SUMMARY

Aspects of one or more example embodiments relate to a display apparatus and a method of manufacturing the same, and for example, to a display apparatus with improved reliability and a method of manufacturing the same.

Aspects of one or more example embodiments include a display apparatus having relatively improved light extraction efficiency and relatively clear emission of colors from respective pixels. However, these characteristics are merely examples and the scope of embodiments according to the present disclosure are not limited thereto.

Additional aspects will be set forth in part in the description which follows and, in part, will be apparent from the description, or may be learned by practice of the presented embodiments.

According to one or more example embodiments, a display apparatus includes a first pixel, a second pixel, and a third pixel emitting different colors includes an organic light-emitting diode on a substrate and including a pixel electrode, an intermediate layer, and an opposite electrode, a black matrix on the organic light-emitting diode, a column spacer on the same layer as the black matrix and spaced apart from the black matrix by a first distance in a plan view, and a first quantum conversion layer on the substrate to correspond to an emission area of the first pixel and including first quantum dots.

According to some example embodiments, the first distance may be about 1 µm or more.

According to some example embodiments, the black matrix and the column spacer may include a same material.

According to some example embodiments, the display apparatus may further include a thin-film encapsulation layer covering the organic light-emitting diode, wherein the black matrix and the column spacer may be on the thin-film encapsulation layer.

According to some example embodiments, the column spacer may have a first thickness from the thin-film encapsulation layer, and the black matrix may have a second thickness from the thin-film encapsulation layer, the second thickness being smaller than the first thickness.

According to some example embodiments, the display apparatus may further include a pixel definition layer on the pixel electrode and including a first opening exposing at least a portion of the pixel electrode, wherein the black matrix may at least partially overlap the pixel definition layer.

According to some example embodiments, the display apparatus may further include a second quantum conversion layer on the substrate to correspond to an emission area of the second pixel and including second quantum dots, and a transmission layer on the substrate to correspond to an emission area of the third pixel and including scattering particles, wherein an average size of the first quantum dots may be greater than an average size of the second quantum dots.

According to some example embodiments, the display apparatus may further include a first color filter overlapping the first quantum conversion layer, a second color filter overlapping the second quantum conversion layer and having a different color than the first color filter, and a third color filter overlapping the transmission layer and having a different color than the first color filter and the second color filter.

According to some example embodiments, the display apparatus may further include an upper substrate arranged on the first color filter, the second color filter, and the third color filter.

According to some example embodiments, the organic light-emitting diode may emit blue light.

According to one or more example embodiments, in a method of manufacturing a display apparatus including a first pixel, a second pixel, and a third pixel emitting different colors, the method includes forming an organic light-emitting diode on a substrate, forming a black matrix and a column spacer on the organic light-emitting diode, and bonding the substrate where the black matrix and the column spacer are formed to an upper substrate where a first quantum conversion layer, a second quantum conversion layer, and a transmission layer are formed.

According to some example embodiments, the method may further include, after the forming of the organic light-emitting diode on the substrate, forming a thin-film encapsulation layer on the organic light-emitting diode.

According to some example embodiments, the black matrix and the column spacer may be formed on the thin-film encapsulation layer.

According to some example embodiments, the forming of the black matrix and the column spacer may include forming a color material layer on the thin-film encapsulation layer, exposing a portion of the color material layer, forming a black matrix and a column spacer by developing the exposed color material layer, and baking the black matrix and the column spacer.

According to some example embodiments, the column spacer may be arranged on the same layer as the black matrix and may be spaced apart from the black matrix by a first distance in a plan view.

According to some example embodiments, the first distance may be about 1 μm or more.

According to some example embodiments, the column spacer may have a first thickness from the thin-film encapsulation layer, and the black matrix may have a second thickness from the thin-film encapsulation layer, the second thickness being smaller than the first thickness.

According to some example embodiments, the organic light-emitting diode may include a pixel electrode exposed at least partially by a pixel definition layer, an intermediate layer formed on the pixel electrode, and an opposite electrode formed on the intermediate layer, and the black matrix and the column spacer may at least partially overlap the pixel definition layer.

According to some example embodiments, the first quantum conversion layer may correspond to an emission area of the first pixel and include first quantum dots, the second quantum conversion layer may correspond to an emission area of the second pixel and include second quantum dots, and an average size of the first quantum dots may be greater than an average size of the second quantum dots.

According to some example embodiments, the display apparatus may further include a first color filter overlapping the first quantum conversion layer, a second color filter overlapping the second quantum conversion layer and having a different color than the first color filter, and a third color filter overlapping the transmission layer and having a different color than the first color filter and the second color filter.

Other aspects, features, and characteristics other than those described above will become more apparent from the following detailed description, the appended claims, and the accompanying drawings.

BRIEF DESCRIPTION OF THE DRAWINGS

The above and other aspects, features, and characteristics of certain embodiments will be more apparent from the following description taken in conjunction with the accompanying drawings, in which.

DETAILED DESCRIPTION

Figure 1:
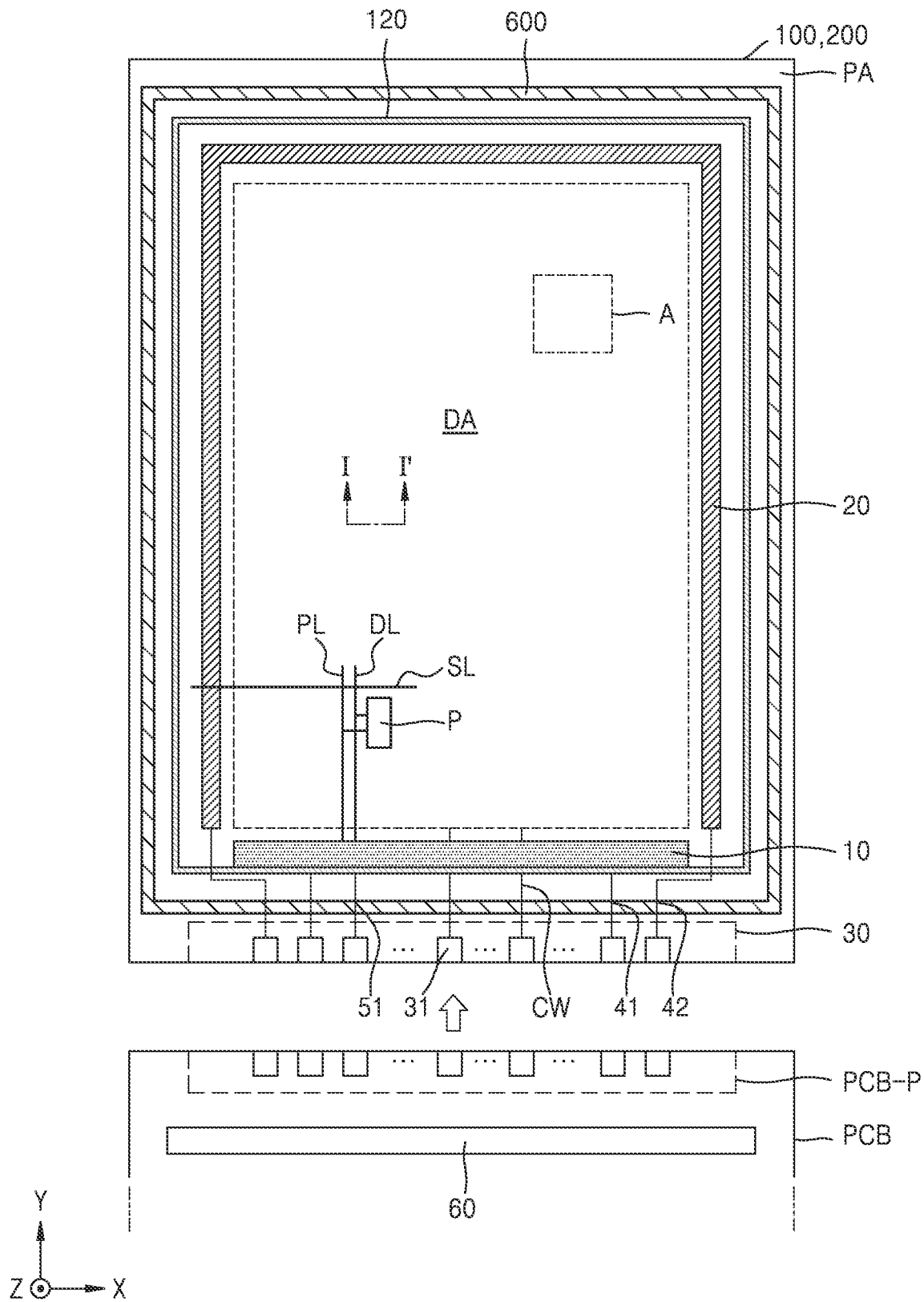
FIGS. 1 and 2 are plan views schematically illustrating a display apparatus according to some example embodiments.

Reference will now be made in more detail to aspects of some example embodiments, which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

It will be understood that although terms such as "first" and "second" may be used herein to describe various components, these components should not be limited by these terms and these terms are only used to distinguish one component from another component.

As used herein, the singular forms "a", "an", and "the" are intended to include the plural forms as well, unless the context clearly indicates otherwise.

Also, it will be understood that the terms "comprise," "include," and "have" used herein specify the presence of stated features or components, but do not preclude the presence or addition of one or more other features or components.

It will be understood that when a layer, region, or component is referred to as being "on" another layer, region, or component, it may be "directly on" the other layer, region, or component or may be "indirectly on" the other layer, region, or component with one or more intervening layers, regions, or components therebetween.

Sizes of components in the drawings may be exaggerated for convenience of description. In other words, because the sizes and thicknesses of components in the drawings are arbitrarily illustrated for convenience of description, the disclosure is not limited thereto.

As used herein, "A and/or B" represents the case of A, B, or A and B. Also, "at least one of A and B" represents the case of A, B, or A and B.

In the following embodiments, the meaning of a line "extending in a first direction or a second direction" may include not only extending in a linear shape but also extending in a zigzag or curved shape along the first direction or the second direction.

In the following embodiments, when referred to as "in a plan view," it may mean that a target portion is viewed from above (e.g., from a direction perpendicular or normal with respect to a plane of the display surface), and when referred to as "in a cross-sectional view," it may mean that a cross-section of a target portion vertically cut is viewed from side. In the following embodiments, when referred to as "overlapping", it may include overlapping "in a plan view" and overlapping "in a cross-sectional view."

Hereinafter, aspects of some example embodiments will be described in more detail with reference to the accompanying drawings, and in the following description, like reference numerals will denote like elements.

Figure 2:
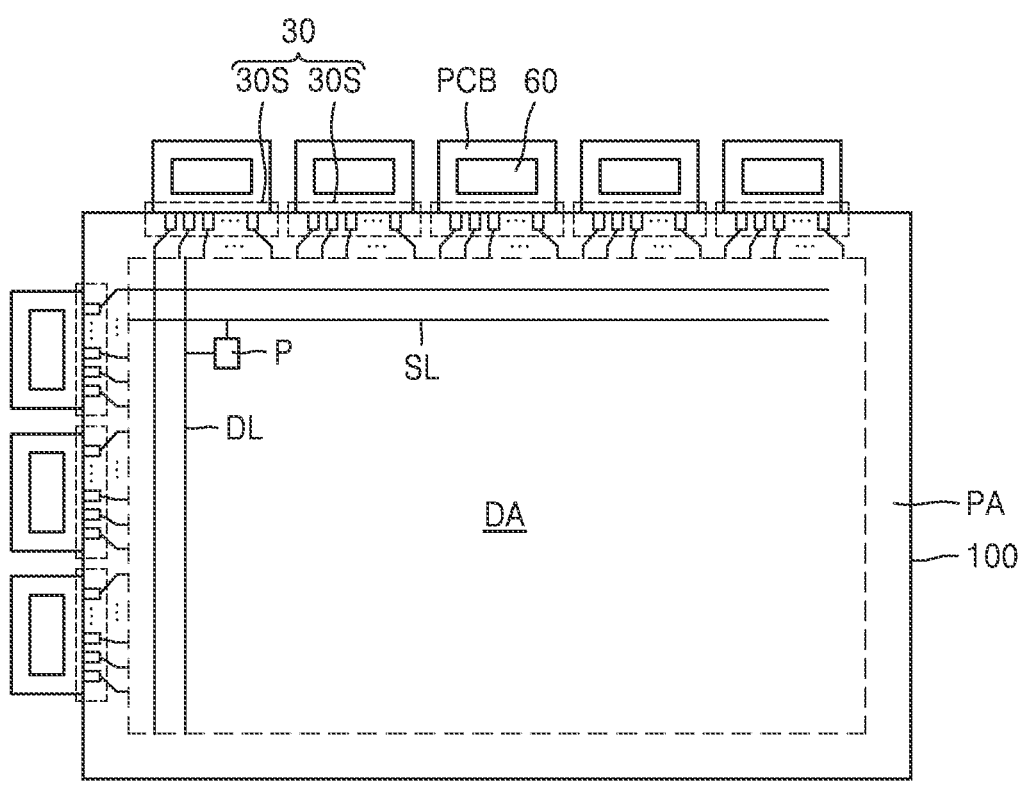

FIGS. 1 and 2 are plan views schematically illustrating a display apparatus according to some example embodiments.

Referring to FIG. 1, the display apparatus may be formed by bonding a substrate 100 to an upper substrate 200 by using a sealing member 600. The sealing member 600 may be formed to surround the substrate 100 and the outer surface of the upper substrate 200 to bond the substrate 100 to the upper substrate 200.

The display apparatus may include a display area DA and a peripheral area PA arranged around the display area DA (e.g., outside a footprint of the display area DA). The display apparatus may display images by using the light emitted from a plurality of pixels P arranged in the display area DA.

The display area DA may include a scan line SL extending in a first direction (X direction) and pixels P connected to a data line DL extending in a second direction (Y direction) intersecting with the first direction (X direction). Each pixel P may also be connected to a driving voltage line PL extending in the second direction (Y direction).

The pixels P may each include a display element such as an organic light-emitting diode OLED. Each pixel P may emit, for example, red, green, blue, or white light from the organic light-emitting diode OLED. As described above, herein, the pixel P may be understood as a pixel emitting any one of red light, green light, blue light, and white light. In some embodiments, all of the organic light-emitting diodes OLED included in the pixels P may emit the same color, and the color of each pixel P may be implemented by a color filter or the like arranged over the organic light-emitting diode OLED. For example, the organic light-emitting diode OLED included in the pixels P may emit blue light.

Each pixel P may be electrically connected to built-in circuits arranged in the peripheral area PA. A first power supply line 10, a second power supply line 20, and a pad portion 30 may be arranged in the peripheral area PA.

The first power supply line 10 may be arranged to correspond to one side of the display area DA. The first power supply line 10 may be connected to a plurality of driving voltage lines PL configured to transmit a driving voltage ELVDD (see FIGS. 3 and 4 described below) to the pixel P.

The second power supply line 20 may partially surround the display area DA in a loop shape with one side open. The second power supply line 20 may provide a common voltage to an opposite electrode of the pixel P. The second power supply line 20 may be referred to as a common voltage supply line.

The pad portion 30 may include a plurality of pads 31 and may be arranged at one side of the substrate 100. Each of the pads 31 may be connected to a first connection line 41 connected to the first power supply line 10 or connection lines CW extending to the display area DA. The pads 31 of the pad portion 30 may be exposed, by not being covered by an insulating layer, and be electrically connected to a printed circuit board PCB. A PCB terminal portion PCB-P of the printed circuit board PCB may be electrically connected to the pad portion 30.

The printed circuit board PCB may be configured to transmit power or signals of a controller to the pad portion 30. The controller may provide a driving voltage ELVDD (see FIGS. 3 and 4 described below) and a common voltage ELVSS (see FIGS. 3 and 4 described below) to the first power supply line 10 and the second power supply line 20 through a first connection line 41 and a second connection line 42, respectively.

A data driving circuit 60 may be electrically connected to the data line DL. A data signal of the data driving circuit 60 may be provided to each pixel P through the connection line CW connected to the pad portion 30 and the data line DL connected to the connection line CW. FIG. 1 illustrates that the data driving circuit 60 is arranged on the printed circuit board PCB; however, according to some example embodiments, the data driving circuit 60 may be arranged on the substrate 100. For example, the data driving circuit 60 may be arranged between the pad portion 30 and the first power supply line 10.

A dam portion 120 may be arranged in the peripheral area PA. When an organic encapsulation layer 420 of a thin-film encapsulation layer 400 (see FIG. 5) is formed, the dam portion 120 may block an organic material from flowing in the edge direction of the substrate 100 to prevent or reduce instances of an edge tail of the organic encapsulation layer 420 being formed. The dam portion 120 may be arranged to surround at least a portion of the display area DA on the peripheral area PA. The dam portion 120 may be configured to include a plurality of dams, and when a plurality of dams are arranged, the respective dams may be formed to be spaced apart from each other. In the peripheral area PA, the dam portion 120 may be arranged closer to the display area DA than the sealing member 600. According to some example embodiments, a built-in driving circuit unit for providing a scan signal of each pixel may be further included in the peripheral area PA. According to some embodiments, the built-in driving circuit unit and the dam portion 120 may be formed to overlap each other.

Although FIG. 1 illustrates that one printed circuit board PCB is attached to the pad portion 30, a plurality of printed circuit boards PCB may be attached to the pad portion 30 as illustrated in FIG. 2.

Also, according to some example embodiments, the pad portion 30 may be arranged along two or more sides of the substrate 100. The pad portion 30 may include a plurality of sub-pad portions 30S, and one printed circuit board PCB may be attached to each sub-pad portion 30S.

Figure 3:
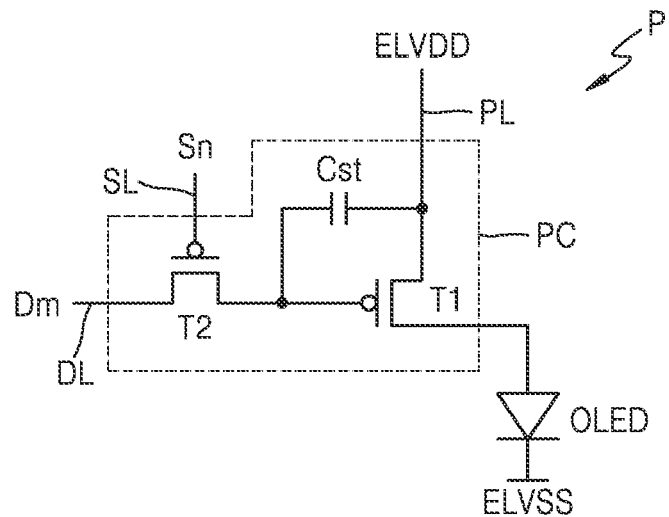
FIGS. 3 and 4 are equivalent circuit diagrams of a pixel that may be included in a display apparatus according to some example embodiments.
Figure 4:
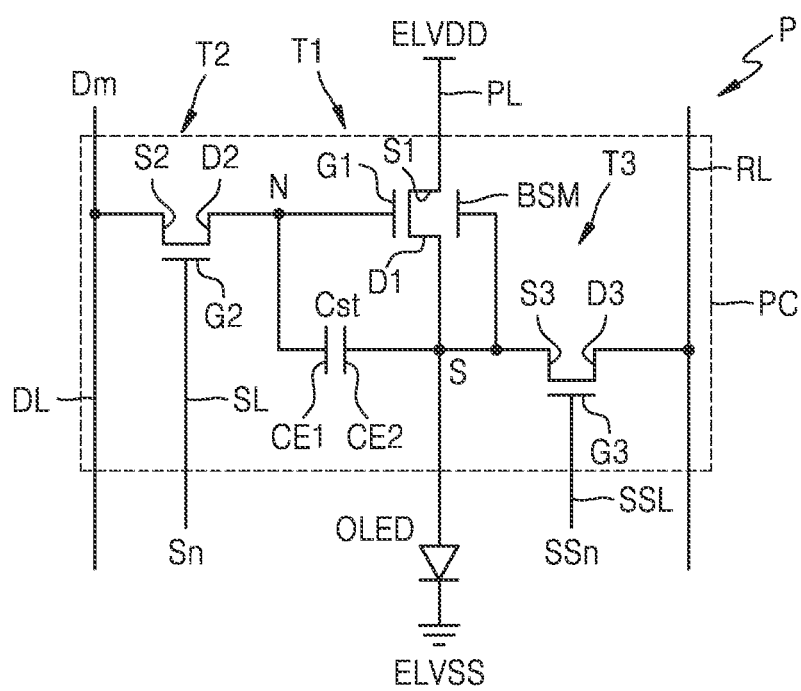

FIGS. 3 and 4 are equivalent circuit diagrams of a pixel that may be included in a display apparatus according to some example embodiments.

Referring to FIG. 3, each pixel P may include a pixel circuit PC connected to a scan line SL and a data line DL and an organic light-emitting diode OLED connected to the pixel circuit PC.

The pixel circuit PC may include a driving thin-film transistor T1, a switching thin-film transistor T2, and a storage capacitor Cst. The switching thin-film transistor T2 may be connected to a scan line SL and a data line DL and may be configured to transmit a data signal Dm input through the data line DL to the driving thin-film transistor T1 according to a scan signal Sn input through the scan line SL.

The storage capacitor Cst may be connected to the switching thin-film transistor T2 and the driving voltage line PL and may store a voltage corresponding to the difference between the voltage received from the switching thin-film transistor T2 and the first power voltage ELVDD (or driving voltage) supplied to the driving voltage line PL.

The driving thin-film transistor T1 may be connected to the driving voltage line PL and the storage capacitor Cst and may control a driving current flowing from the driving voltage line PL through the organic light-emitting diode OLED in response to a voltage value stored in the storage capacitor Cst. The organic light-emitting diode OLED may emit light with a certain brightness according to the driving current.

Although FIG. 3 illustrates that the pixel circuit PC includes two thin-film transistors and one storage capacitor, embodiments according to the present disclosure are not limited thereto. For example, according to some example embodiments, the pixel circuit PC may include additional electrical circuit components, or fewer electrical circuit components, without departing from the spirit and scope of embodiments according to the present disclosure.

Referring to FIG. 4, each pixel P may include an organic light-emitting diode OLED and a pixel circuit PC including a plurality of thin-film transistors configured to drive the organic light-emitting diode OLED. The pixel circuit PC may include a driving thin-film transistor T1, a switching thin-film transistor T2, a sensing thin-film transistor T3, and a storage capacitor Cst.

A scan line SL may be connected to a gate electrode G2 of the switching thin-film transistor T2, a data line DL may be connected to a source electrode S2 thereof, and a first electrode CE1 of the storage capacitor Cst may be connected to a drain electrode D2 thereof.

Accordingly, the switching thin-film transistor T2 may supply a data voltage of the data line DL to a first node N in response to a scan signal Sn from the scan line SL of each pixel P.

A gate electrode G1 of the driving thin-film transistor T1 may be connected to the first node N, a source electrode S1 thereof may be connected to a driving voltage line PL configured to transmit a driving voltage ELVDD, and a drain electrode D1 thereof may be connected to a pixel electrode of the organic light-emitting diode OLED.

Accordingly, the driving thin-film transistor T1 may adjust the amount of a current flowing through the organic light-emitting diode OLED according to a source-gate voltage Vgs of the driving thin-film transistor T1, that is, a voltage applied between the driving voltage ELVDD and the first node N.

A sensing control line SSL may be connected to a gate electrode G3 of the sensing thin-film transistor T3, a source electrode S3 thereof may be connected to a second node S, and a drain electrode D3 thereof may be connected to a reference voltage line RL. In some embodiments, the sensing thin-film transistor T3 may be controlled by the scan line SL instead of by the sensing control line SSL.

The sensing thin-film transistor T3 may sense the potential of the pixel electrode of the organic light-emitting diode OLED. The sensing thin-film transistor T3 may supply a pre-charging voltage from the reference voltage line RL to the second node S in response to a sensing signal SSn from the sensing control line SSL or may supply a voltage of the pixel electrode of the organic light-emitting diode OLED to the reference voltage line RL in a sensing period.

The storage capacitor Cst may include a first electrode CE1 connected to the first node N and a second electrode CE2 connected to the second node S. The storage capacitor Cst may charge a difference voltage between the voltages respectively supplied to the first and second nodes N and S and may supply a driving voltage to the driving thin-film transistor T1. For example, the storage capacitor Cst may charge a difference voltage between a data signal Dm and a pre-charging voltage Vpre respectively supplied to the first node N and the second node S.

A bias electrode BSM may be formed to correspond to the driving thin-film transistor T1 and may be connected to the source electrode S3 of the sensing thin-film transistor T3. Because the bias electrode BSM may be supplied with a voltage in conjunction with the potential of the source electrode S3 of the sensing thin-film transistor T3, the driving thin-film transistor T1 may be stabilized. In some example embodiments, the bias electrode BSM may be connected to a separate bias line without being connected to the source electrode S3 of the sensing thin-film transistor T3.

An opposite electrode of the organic light-emitting diode OLED may be provided with a common voltage ELVSS. The organic light-emitting diode OLED may emit light by receiving a driving current from the driving thin-film transistor T1.

Although FIG. 4 illustrates that each pixel circuit PC includes the signal lines SL, SSL, and DL, the reference voltage line RL, and the driving voltage line PL, embodiments according to the present disclosure are not limited thereto. For example, at least one of the signal lines SL, SSL, and DL, and/or the reference voltage line RL, and the driving voltage line PL may be shared by adjacent pixels.

The pixel circuit PC is not limited to the number and circuit design of the thin-film transistors and storage capacitor described with reference to FIGS. 3 and 4, and the number of components and the circuit design thereof may be variously modified without departing from the spirit and scope of embodiments according to the present disclosure.

Figure 5:
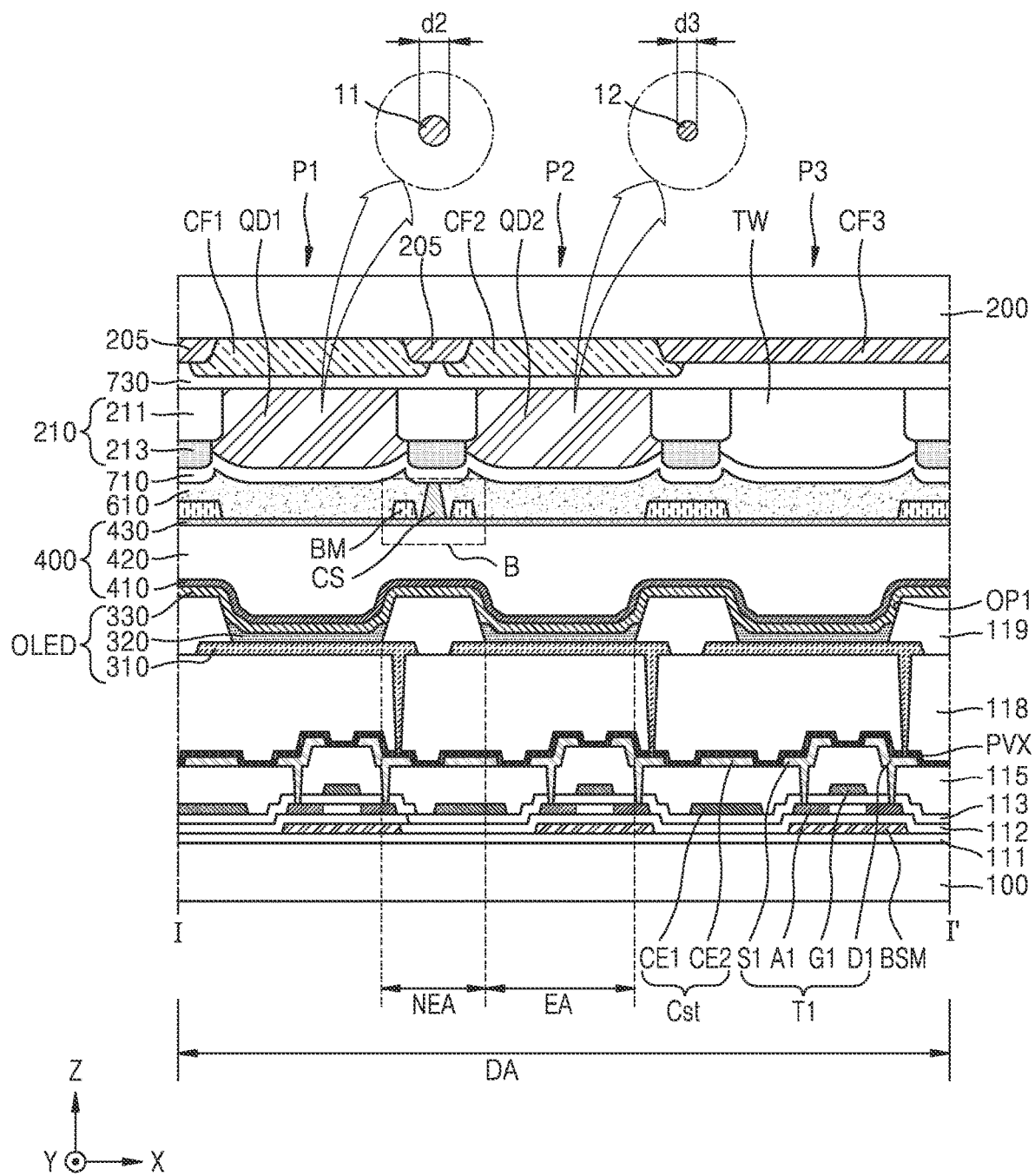
FIG. 5 is a cross-sectional view schematically illustrating a display apparatus according to some example embodiments.

FIG. 5 is a cross-sectional view schematically illustrating a display apparatus according to some example embodiments. For example, FIG. 5 is a cross-sectional view illustrating a portion of a display area of a display apparatus according to some example embodiments, which may correspond to a cross-sectional view of the display apparatus taken along the line I-I' of FIG. 1.

Referring to FIG. 5, at least one thin-film transistor T1 and a display device connected to the thin-film transistor T1 may be arranged on a display area DA of the display apparatus according to some example embodiments.

In the display area DA of FIG. 3, the driving thin-film transistor T1 and the storage capacitor Cst in the pixel circuit PC of each pixel P described with reference to FIGS. 3 and 4 are illustrated.

According to some example embodiments, the display area DA of the display apparatus may include a plurality of pixels P1, P2, and P3, and each pixel P1, P2, or P3 may include an emission area EA. The emission area EA may be an area where light is generated and emitted to the outside. A non-emission area NEA may be defined between the emission areas EA, and the emission areas EA of the pixels P1, P2, and P3 may be separated by the non-emission area NEA.

A first pixel P1, a second pixel P2, and a third pixel P3 may implement light of different colors. For example, the first pixel P1 may implement or emit red light, the second pixel P2 may implement or emit green light, and the third pixel P3 may implement or emit blue light. In a plan view, the emission area EA of each pixel may be provided in various polygonal or circular shapes and may be provided in various arrangements such as a stripe arrangement and a pentile arrangement.

The display apparatus according to some example embodiments may include a quantum conversion layer arranged to correspond to at least one pixel. For example, as in the case of FIG. 5, a first quantum conversion layer QD1 may be arranged to correspond to an emission area of the first pixel P1, and a second quantum conversion layer QD2 may be arranged to correspond to an emission area of the second pixel P2. The first quantum conversion layer QD1 and the second quantum conversion layer QD2 may include quantum dots and scattering particles. The first quantum conversion layer QD1 may include a first quantum dot 11, and the second quantum conversion layer QD2 may include a second quantum dot 12.

A transmission layer TW may be arranged in an emission area of the third pixel P3. The transmission layer TW may include an organic material that may emit light without converting the wavelength of light emitted from the organic light-emitting diode OLED of the third pixel P3.

All of the organic light-emitting diodes OLED included in the first pixel P1, the second pixel P2, and the third pixel P3 may emit the same color. For example, the organic light-emitting diodes OLED may emit blue light.

Hereinafter, for convenience of description, the configuration arranged in the display area DA of FIG. 5 will be described in a stacking order.

A substrate 100 may include a glass material, a ceramic material, a metal material, or a material having flexible or bendable characteristics. When the substrate 100 has flexible or bendable characteristics, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a single-layer or multi-layer structure of the above material, and in the case of the multi-layer structure, it may further include an inorganic layer. In some example embodiments, the substrate 100 may have an organic/inorganic/organic structure.

A first buffer layer 111 may be arranged on the substrate 100. The first buffer layer 111 may be located on the substrate 100 to reduce or block the penetration of foreign materials, moisture, or external air from the bottom of the substrate 100 and may provide a flat surface on the substrate 100. The first buffer layer 111 may include an inorganic material such as oxide or nitride, an organic material, or an organic/inorganic composite and may include a single-layer or multi-layer structure of an inorganic material and an organic material.

A bias electrode BSM may be arranged on the first buffer layer 111 to correspond to a driving thin-film transistor T1. A voltage may be applied to the bias electrode BSM. For example, the bias electrode BSM may be connected to a source electrode S3 (see FIG. 4) of a sensing thin-film transistor T3 (see FIG. 4) such that a voltage of the source electrode S3 may be applied thereto. Also, the bias electrode BSM may prevent the external light from reaching a semiconductor layer A1. Accordingly, the characteristics of the driving thin-film transistor T1 may be stabilized. The bias electrode BSM may be omitted in some cases.

A second buffer layer 112 may be arranged on the bias electrode BSM. According to some example embodiments, the second buffer layer 112 may include the same material as the first buffer layer 111. According to some example embodiments, the second buffer layer 112 may include a different material than the first buffer layer 111.

The semiconductor layer A1 may be arranged on the second buffer layer 112. The semiconductor layer A1 may include amorphous silicon or may include polysilicon. According to some example embodiments, the semiconductor layer A1 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), or zinc (Zn). In some embodiments, the semiconductor layer A1 may include a Zn oxide-based material such as a Zn oxide, an In—Zn oxide, or a Ga—In—Zn oxide. According to some example embodiments, the semiconductor layer A1 may include an IGZO (In—Ga—Zn—O) or ITZO (In—Sn—Zn—O), or IGTZO (In—Ga—Sn—Zn—O) semiconductor containing a metal such as indium (In), gallium (Ga), and tin (Sn) in ZnO. The semiconductor layer A1 may include a channel area and a source area and a drain area arranged on both sides of the channel area. The semiconductor layer A1 may include a single layer or multiple layers.

A first insulating layer 113 may be arranged on the semiconductor layer A1. The first insulating layer 113 may include an inorganic insulating material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first insulating layer 113 may include a single layer or multiple layers including the above inorganic insulating material.

Over the semiconductor layer A1, a gate electrode G1 may be arranged to at least partially overlap the semiconductor layer A1 with the first insulating layer 113 therebetween. The gate electrode G1 may include molybdenum (Mo), aluminum (Al), copper (Cu), titanium (Ti), or the like and may include a single layer or multiple layers. For example, the gate electrode G1 may include a single layer of Mo. A first electrode CE1 of a storage capacitor Cst may be arranged on the same layer as the gate electrode G1. The first electrode CE1 may be formed of the same material as the gate electrode G1.

A second insulating layer 115 may be provided to cover the gate electrode G1 and the first electrode CE1 of the storage capacitor Cst. The second insulating layer 115 may include an inorganic insulating material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second insulating layer 115 may include a single layer or multiple layers including the above inorganic insulating material.

A second electrode CE2 of the storage capacitor Cst, a source electrode S1, a drain electrode D1, and a data line DL may be arranged over the second insulating layer 115.

The second electrode CE2 of the storage capacitor Cst, the source electrode S1, the drain electrode D1, and the data line DL may include a conductive material including molybdenum (Mo), aluminum (Al), copper (Cu), titanium (Ti), or the like and may include a single layer or multiple layers including the above material. According to some example embodiments, the second electrode CE2, the source electrode S1, the drain electrode D1, and the data line DL may include a multilayer structure of Ti/Al/Ti. The source electrode S1 and the drain electrode D1 may be connected to the source area or the drain area of the semiconductor layer A1 through a contact hole.

The second electrode CE2 of the storage capacitor Cst may overlap the first electrode CE1 with the second insulating layer 115 therebetween and may form a capacitance. In this case, the second insulating layer 115 may function as a dielectric layer of the storage capacitor Cst.

The second electrode CE2 of the storage capacitor Cst, the source electrode S1, the drain electrode D1, and the data line DL may be covered by an inorganic protection layer PVX.

The inorganic protection layer PVX may include a single layer or multiple layers of silicon nitride ($SiN_x$) and silicon oxide ($SiO_x$). The inorganic protection layer PVX may be introduced to cover and protect some lines arranged on the second insulating layer 115. Lines formed together in the same process as the data line DL may be exposed in a partial region of the substrate 100 (e.g., a portion of the peripheral area). An exposed portion of the lines may be damaged by an etchant used to pattern a pixel electrode 310 described below; however, according to some example embodiments, because the inorganic protection layer PVX may cover the data line DL and at least a portion of lines formed together with the data line DL, it may be possible to prevent the lines from being damaged in the patterning process of the pixel electrode 310. According to some example embodiments, the inorganic protection layer PVX may be omitted.

A planarization layer 118 may be arranged on the inorganic protection layer PVX, and an organic light-emitting diode OLED may be arranged on the planarization layer 118.

The planarization layer 118 may include a single layer or multiple layers formed of an organic material and may provide a flat top surface. The planarization layer 118 may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend thereof.

In the display area DA of the substrate 100, the organic light-emitting diode OLED may be arranged on the planarization layer 118. The organic light-emitting diode OLED may include a pixel electrode 310, an intermediate layer 320 including an organic emission layer, and an opposite electrode 330.

The pixel electrode 310 may be a (semi)transparent electrode or a reflective electrode. In some embodiments, the pixel electrode 310 may include a reflective layer formed of Ag, Mg, Al, Pt, Pd, Au, Ni, Nd, Ir, Cr, or any compound thereof and a transparent or semitransparent electrode layer formed on the reflective layer. The transparent or semitransparent electrode layer may include at least one of indium tin oxide (ITO), indium zinc oxide (IZO), zinc oxide (ZnO), indium oxide ($In_2O_3$), indium gallium oxide (IGO), or aluminum zinc oxide (AZO). According to some example embodiments, the pixel electrode 310 may include ITO/Ag/ITO.

A pixel definition layer 119 may be arranged on the planarization layer 118, and the pixel definition layer 119 may include an opening corresponding to each pixel in the display area DA, that is, a first opening OP1 exposing at least a portion of the pixel electrode 310, to define the emission area EA of the pixel P. Also, the pixel definition layer 119 may increase the distance between the edge of the pixel electrode 310 and the opposite electrode 330 over the pixel electrode 310 to prevent an arc or the like from occurring at the edge of the pixel electrode 310.

The pixel definition layer 119 may be formed of an organic insulating material of at least one of polyimide, polyamide, acrylic resin, benzocyclobutene, or phenol resin by spin coating or the like.

According to some example embodiments, a spacer for preventing mask imprinting may be further arranged on the pixel definition layer 119. The spacer may be integrally formed with the pixel definition layer 119. For example, the spacer and the pixel definition layer 119 may be simultaneously formed in the same process by using a halftone mask.

The intermediate layer 320 of the organic light-emitting diode OLED may include an organic emission layer. The organic emission layer may include an organic material including a fluorescent or phosphorescent material emitting red, green, blue, or white light. The organic emission layer may include a low molecular weight organic material or a high molecular weight organic material, and functional layers such as a hole transport layer (HTL), a hole injection layer (HIL), an electron transport layer (ETL), and an electron injection layer (EIL) may optionally be further included under and over the organic emission layer. The intermediate layer 320 may be arranged corresponding to each of a plurality of pixel electrodes 310. However, embodiments according to the present disclosure are not limited thereto. The intermediate layer 320 may be modified in various ways such as to be integrally provided over the plurality of pixel electrodes 310.

Although FIG. 5 illustrates that the intermediate layer 320 is separately provided for each pixel P1, P2, or P3, embodiments according to the present disclosure are not limited thereto. The intermediate layer 320 may be integrally provided with each pixel P1, P2, or P3.

According to some example embodiments, all of the organic light-emitting diodes OLED included in the first pixel P1, the second pixel P2, and the third pixel P3 may organic emission layers emitting the same color. For example, all of the organic light-emitting diodes OLED included in the first pixel P1, the second pixel P2, and the third pixel P3 may emit blue light.

The opposite electrode 330 may be a transparent electrode or a reflective electrode. In some embodiments, the opposite electrode 330 may be a transparent or semitransparent electrode and may include a thin metal layer having a low work function and including Li, Ca, LiF/Ca, LiF/Al, Al, Ag, Mg, or any compound thereof. Also, a transparent conductive oxide (TCO) layer such as ITO, IZO, ZnO, or $In_2O_3$ may be further arranged on the thin metal layer. The opposite electrode 330 may be arranged over the display area DA and a peripheral area PA and may be arranged over the intermediate layer 320 and the pixel definition layer 119. The opposite electrode 330 may be integrally formed in a plurality of organic light-emitting diodes OLED to correspond to a plurality of pixel electrodes 310. According to some example embodiments, the opposite electrode 330 may be patterned through a fine metal mask to be formed on the intermediate layer 320.

The organic light-emitting diode OLED may be easily damaged by the moisture or oxygen from the outside and therefore may be protected by being covered with a thin-film encapsulation layer 400. The thin-film encapsulation layer 400 may cover the display area DA and extend to the outside of the display area DA. The thin-film encapsulation layer 400 may include at least one organic encapsulation layer and at least one inorganic encapsulation layer. For example, the thin-film encapsulation layer 400 may include a first inorganic encapsulation layer 410, an organic encapsulation layer 420, and a second inorganic encapsulation layer 430.

The first inorganic encapsulation layer 410 may cover the opposite electrode 330 and may include silicon oxide, silicon nitride, and/or silicon trioxynitride. According to some example embodiments, other layers such as a capping layer may be located between the first inorganic encapsulation layer 410 and the opposite electrode 330 when necessary. Because the first inorganic encapsulation layer 410 is formed along the structure thereunder, the top surface thereof may not be flat. The organic encapsulation layer 420 may cover the first inorganic encapsulation layer 410 and may have a flat top surface unlike the first inorganic encapsulation layer 410. Particularly, the organic encapsulation layer 420 may have a flat top surface at a portion corresponding to the display area DA. The organic encapsulation layer 420 may include at least one of polyethylene terephthalate, polyethylene naphthalate, polycarbonate, polyimide, polyethylene sulfonate, polyoxymethylene, polyarylate, or hexamethyldisiloxane. The second inorganic encapsulation layer 430 may cover the organic encapsulation layer 420 and may include silicon oxide, silicon nitride, and/or silicon trioxynitride. Because the second inorganic encapsulation layer 430 is formed on the organic encapsulation layer 420 having a flat top surface, the second inorganic encapsulation layer 430 may also have a flat top surface.

Although a crack may occur in the thin-film encapsulation layer 400 through the above multi-layer structure, such a crack may not be connected between the first inorganic encapsulation layer 410 and the organic encapsulation layer 420 or between the organic encapsulation layer 420 and the second inorganic encapsulation layer 430. Accordingly, the formation of a path through which the moisture or oxygen from the outside penetrates into the display area DA may be prevented, minimized, or reduced.

A filler 610 may be arranged over the thin-film encapsulation layer 400. The filler 610 may buffer the external pressure. The filler 610 may include an organic material such as methyl silicone, phenyl silicone, or polyimide. However, embodiments according to the present disclosure are not limited thereto, and the filler 610 may include a urethane-based resin, an epoxy-based resin, or an acrylic resin that is an organic sealant, or silicone that is an inorganic sealant.

A black matrix BM and a column spacer CS may be arranged on the thin-film encapsulation layer 400. More particularly, the black matrix BM and the column spacer CS may be arranged on the second inorganic encapsulation layer 430 of the thin-film encapsulation layer 400. Because the column spacer CS is arranged on the second inorganic encapsulation layer 430 having a flat top surface, the thickness distribution of the column spacer CS may be reduced.

Figure 6:
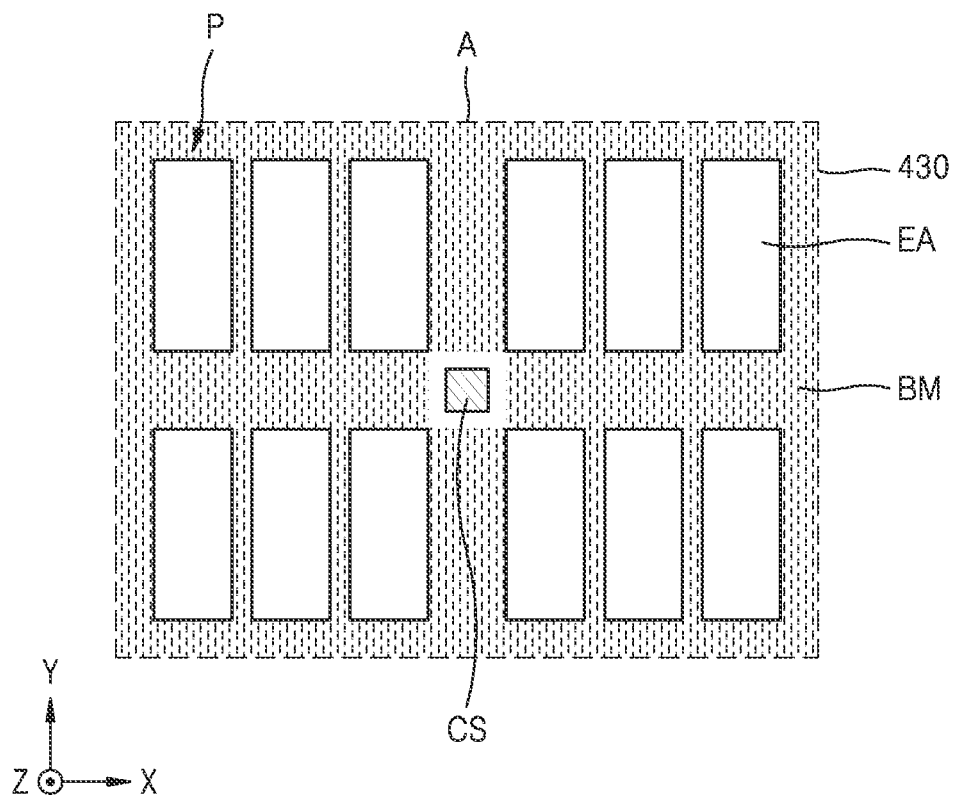
FIG. 6 is a plan view schematically illustrating a display apparatus according to some example embodiments.

FIG. 6 is a plan view schematically illustrating a display apparatus according to some example embodiments. For example, FIG. 6 is a view illustrating the arrangement position of a column spacer CS and a black matrix BM included in a display apparatus according to some example embodiments, which may be an enlarged view of a region A of FIG. 1.

Referring to FIGS. 5 and 6, a column spacer CS and a black matrix BM may be arranged on the second inorganic encapsulation layer 430. The black matrix BM may at least partially overlap the pixel definition layer 119 arranged thereunder and may be arranged on the second inorganic encapsulation layer 430. Because the black matrix BM at least partially overlaps the pixel definition layer 119, the black matrix BM may at least partially overlap the non-emission area NEA of each pixel P. Thus, the black matrix BM may not overlap the emission area EA of each pixel P.

The column spacer CS may be at least partially spaced apart from the black matrix BM and may be arranged on the second inorganic encapsulation layer 430. The column spacer CS may at least partially overlap the pixel definition layer 119 arranged thereunder. Because the column spacer CS at least partially overlaps the pixel definition layer 119, the column spacer CS may at least partially overlap the non-emission area NEA of each pixel P. Thus, the column spacer CS may not overlap the emission area EA of each pixel P.

Although FIG. 6 illustrates a case where the column spacer CS is arranged to be spaced apart from the pixel P in the first direction (X direction) and the second direction (Y direction), embodiments according to the present disclosure are not limited thereto. For example, the column spacer CS may be arranged at various positions such as between adjacent pixels P in the first direction (X direction) and between adjacent pixels P in the second direction (Y direction).

Referring back to FIG. 5, the black matrix BM may be a member for improving the color clarity and contrast. The black matrix BM may include at least one of black pigment, black dye, or black particles. In some embodiments, the black matrix BM may include a material such as Cr, $CrO_x$, $Cr/CrO_x$, $Cr/CrO_x/CrN_y$, resin (e.g., carbon pigment or RGB mixed pigment), graphite, or non-Cr. The black matrix BM may prevent, minimize, or reduce light color mixing by absorbing the light emitted from the organic light-emitting diode OLED arranged thereunder or absorbing the light reflected from the quantum conversion layer and the color filter arranged thereover.

The column spacer CS may be arranged on the same layer as the black matrix BM. The column spacer CS may function to maintain a constant distance between the substrate 100 and the upper substrate 200 (see FIG. 1).

Figure 7:
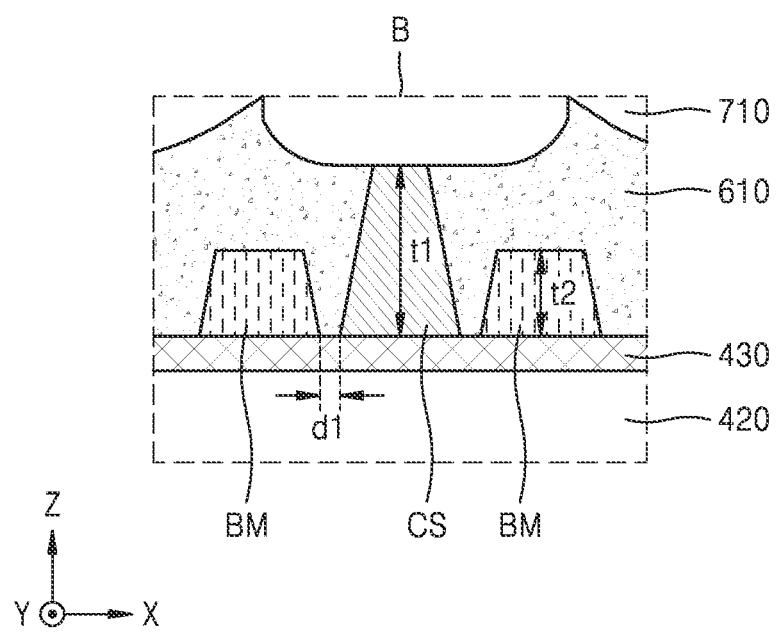
FIG. 7 is an enlarged view schematically illustrating a display apparatus according to some example embodiments.

FIG. 7 is an enlarged view schematically illustrating a display apparatus according to some example embodiments. More particularly, FIG. 7 corresponds to an enlarged view of a region B of FIG. 5.

Referring to FIG. 7, the column spacer CS may be arranged on the same layer as the black matrix BM and may be at least partially spaced apart from the black matrix BM.

The column spacer CS may be arranged to be spaced apart from the black matrix BM by a first distance d1 in a plan view. According to some example embodiments, the first distance d1 may be variously modified such as about 1 μm or more and about 50 μm or less, about 1 μm or more and about 20 μm or less, and about 1 μm or more and about 15 μm or less. For example, the first distance d1 may be about 1 μm or more and about 10 μm or less.

The column spacer CS may have a first thickness t1 from the thin-film encapsulation layer 400, and the black matrix BM may have a second thickness t2 smaller than the first thickness t1 from the thin-film encapsulation layer 400. More particularly, the column spacer CS may have a first thickness t1 from the second inorganic encapsulation layer 430, and the black matrix BM may have a second thickness t2 smaller than the first thickness t1 from the second inorganic encapsulation layer 430.

The column spacer CS and the black matrix BM may be simultaneously formed in the same process by using a halftone mask, as described below in a method of manufacturing a display apparatus. The column spacer CS may be arranged on the same layer as the black matrix BM and may be formed to be spaced apart from the black matrix BM such that the thickness distribution of the column spacer CS may be reduced.

The column spacer CS may include the same material as the black matrix BM. Thus, the column spacer CS may prevent, minimize, or reduce light color mixing by absorbing the light emitted from the organic light-emitting diode OLED arranged thereunder or absorbing the light reflected from the quantum conversion layer and the color filter arranged thereover.

Referring back to FIG. 5, color filters CF1, CF2, and CF3, and a light blocking pattern 205 may be provided on the upper substrate 200 arranged to face the substrate 100. The color filters CF1, CF2, and CF3 may be introduced to implement full color images and improve color purity and outdoor visibility. The first color filter CF1 may be implemented with the same color as the light from the first quantum conversion layer QD1, may be implemented with the same color as the light from the second color filter CF2, and may be implemented with the same color as the light from the organic light-emitting diode OLED.

The light blocking pattern 205 may be arranged between the first to third color filters CF1, CF2, and CF3 to correspond to the non-emission area NEA. The light blocking pattern 205 may be a member for improving the color clarity and contrast. The light blocking pattern 205 may include at least one of black pigment, black dye, or black particles. In some embodiments, the light blocking pattern 205 may include a material such as Cr, $CrO_x$, $Cr/CrO_x$, $Cr/CrO_x/CrN_y$, resin (e.g., carbon pigment or RGB mixed pigment), graphite, or non-Cr. In some embodiments, the light blocking pattern 205 may be formed by overlapping at least two of the first color filter CF1, the second color filter CF2, and the third color filter CF3. For example, the third color filter CF3 may be arranged between the first pixel P1 and the second pixel P2, and a portion of the first color filter CF1 and the second color filter CF2 may overlap the third color filter CF3 to function as the light blocking pattern 205.

According to some example embodiments, a first quantum conversion layer QD1, a second quantum conversion layer QD2, a transmission layer TW, and a partition wall 210 may be arranged between the upper substrate 200 and the organic light-emitting diode OLED arranged on the substrate 100.

The first quantum conversion layer QD1 may include a first quantum dot 11, and the second quantum conversion layer QD2 may include a second quantum dot 12. The first quantum dot 11 and the second quantum dot 12 may exhibit unique excitation and emission characteristics according to the material and size thereof and accordingly may convert incident light into a certain color light. Various materials may be used as the first quantum dot 11 and the second quantum dot 12. For example, the first quantum dot 11 and the second quantum dot 12 may be selected from a Group II-VI compound, a Group III-V compound, a Group IV-VI compound, a group IV element, a Group IV compound, and any combination thereof. The Group II-VI compound may be selected among a binary compound selected from CdSe, CdTe, ZnS, ZnSe, ZnTe, ZnO, HgS, HgSe, HgTe, MgSe, MgS, and any mixture thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and any mixture thereof. The Group III-V compound may be selected among a binary compound selected from GaN, GaP, GaAs, GaSb, AlN, AlP, AlAs, AlSb, InN, InP, InAs, InSb, and any mixture thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and any mixture thereof; and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof. The Group IV-VI compound may be selected among a binary compound selected from SnS, SnSe, SnTe, PbS, PbSe, PbTe, and any mixture thereof; a ternary compound selected from SnSeS, SnSeTe, SnSTe, PbSeS, PbSeTe, PbSTe, SnPbS, SnPbSe, SnPbTe, and any mixture thereof; and a quaternary compound selected from SnPbSSe, SnPbSeTe, SnPbSTe, and any mixture thereof. The Group IV element may be selected from Si, Ge, and any mixture thereof. The Group IV compound may include a binary compound selected from SiC, SiGe, and any mixture thereof.

In this case, the binary compound, the ternary compound, or the quaternary compound may exist in particles at a uniform concentration or may exist in the same particle with a concentration distribution partially divided into different states.

The first quantum dot 11 and the second quantum dot 12 may be formed of a core-shell structure having a core and a shell. The interface between the core and the shell may have a concentration gradient in which the concentration of elements in the shell decreases toward the center thereof. The shell of the quantum dot may function as a protection layer for preventing or reducing chemical modification of the core to maintain semiconductor characteristics and/or as a charging layer for assigning electrophoretic characteristics to the quantum dot. The shell may include a single layer or multiple layers. The interface between the core and the shell may have a concentration gradient in which the concentration of elements in the shell decreases toward the center thereof. Examples of the shells of the first quantum dot 11 and the second quantum dot 12 may include a metal or nonmetal oxide, a semiconductor compound, or a combination thereof.

For example, the metal or nonmetal oxide may include a binary compound such as $SiO_2$, $Al_2O_3$, $TiO_2$, ZnO, MnO, $Mn_2O_3$, $Mn_3O_4$, CuO, FeO, $Fe_2O_3$, Fe3O4, CoO, $Co_3O_4$, or NiO or a ternary compound such as $MgAl_2O_4$, $CoFe_2O_4$, $NiFe_2O_4$, or $CoMn_2O_4$; however, embodiments according to the present disclosure are not limited thereto.

The semiconductor compound may include, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like; however, embodiments according to the present disclosure are not limited thereto.

The first quantum dot 11 and the second quantum dot 12 may have a size of about 45 nm or less, for example, about 40 nm or less or about 30 nm or less, and may improve the color purity or color reproducibility in this range. Also, because the light emitted through the quantum dot is emitted in all directions, the optical viewing angle thereof may be improved.

Also, the shapes of the first quantum dot 11 and the second quantum dot 12 may be those generally used in the art and may include, but not limited to, spherical, pyramidal, multi-arm, or cubic nanoparticles, nanotubes, nanowires, nanofibers, nanoplate particles, or the like.

The cores of the first quantum dot 11 and the second quantum dot 12 may have a diameter of about 2 nm to about 10 nm, and when the first quantum dot 11 and the second quantum dot 12 are exposed to light, because light of a particular frequency may be emitted according to the particle size and the material type, the average size of the first quantum dots 11 and the average size of the second quantum dots 12 may be different from each other. For example, the color of a longer wavelength may be emitted as the quantum dot size increases. Thus, the quantum dot size may be selected according to the color of the first pixel P1 and the second pixel P2.

According to some example embodiments, all of the organic light-emitting diodes OLED included in each pixel P1, P2, or P3 may emit light of the same wavelength, and the color of the first pixel P1 and the second pixel P2 may be determined by the color emitted by the first quantum dot 11 and the second quantum dot 12. Because a quantum conversion layer is not provided corresponding to the emission area EA of the third pixel P3, the color of the third pixel P3 may be determined by the color emitted by the organic light-emitting diode OLED. For example, the organic light-emitting diode OLED may emit light of a blue wavelength, the first pixel P1 may implement a red color, the second pixel P2 may implement a green color, and the third pixel P3 may implement a blue color.

Thus, the first quantum dot 11 and the second quantum dot 12 may have different materials and/or sizes. In some embodiments, the first quantum dot 11 and the second quantum dot 12 may include the same material and may have different sizes. For example, a diameter d2 of the first quantum dot 11 may be greater than a diameter d3 of the second quantum dot 12.

The first quantum dot 11 and the second quantum dot 12 may be provided in plurality, and the average size of the first quantum dots 11 may be different from the average size of the second quantum dots 12.

In some embodiments, the cores of the first quantum dot 11 and the second quantum dot 12 may include CdSe. In this case, the average size of the cores of the first quantum dots 11, for example, the average diameter d2 thereof, may be about 5 nm, and the average diameter d3 of the cores of the second quantum dots 12 may be about 3 nm.

In addition to quantum dots, the quantum conversion layers QD1 and QD2 may further include various materials for allowing the quantum dots to be mixed and suitably dispersed. For example, a solvent, a photoinitiator, a binder polymer, and a dispersant may be further included.

A quantum conversion layer may not correspond to the emission area of the third pixel P3, and the transmission layer TW may be arranged therein. The transmission layer TW may include an organic material that may emit light without converting the wavelength of light emitted from the organic light-emitting diode OLED of the third pixel P3.

The partition wall 210 may be arranged between the first quantum conversion layer QD1, the second quantum conversion layer QD2, and the transmission layer TW to correspond to the non-emission area NEA. Particularly, the partition wall 210 may be arranged between the first quantum conversion layer QD1 and the second quantum conversion layer QD2 and between the second quantum conversion layer QD2 and the transmission layer TW.

Because the partition wall 210 includes an opening exposing at least a portion of the color filters CF1, CF2, and CF3, the first quantum conversion layer QD1 may be arranged to correspond to the first color filter CF1 on the opening exposed by the partition wall 210, the second quantum conversion layer QD2 may be arranged to correspond to the second color filter CF2, and the transmission layer TW may be arranged to correspond to the third color filter CF3.

The partition wall 210 may include a first partition wall 211 and a second partition wall 213. The first partition wall 211 and the second partition wall 213 may block or absorb the light incident from the organic light-emitting diode OLED.

According to some example embodiments, the second partition wall 213 may include a liquid-repellent material. The first quantum conversion layer QD1, the second quantum conversion layer QD2, and the transmission layer TW may be formed by an inkjet coating method after forming the partition wall 210 on the side of the upper substrate 200. In this case, a liquid-repellent material may be included in the second partition wall 213 to assign liquid-repellent characteristics such that the organic material forming the first quantum conversion layer QD1, the second quantum conversion layer QD2, and the transmission layer TW may not be applied to a non-display area NDA. According to some example embodiments, the second partition wall 213 may be omitted.

A first protection layer 710 and a second protection layer 730 may be provided under and over the first quantum conversion layer QD1, the second quantum conversion layer QD2, the transmission layer TW, and the partition wall 210. The first protection layer 710 and the second protection layer 730 may protect and prevent or reduce instances of the first quantum conversion layer QD1, the second quantum conversion layer QD2, and/or the transmission layer TW being contaminated by other components arranged thereunder and thereover. The first protection layer 710 and the second protection layer 730 may include an inorganic insulating material. For example, the first protection layer 710 and the second protection layer 730 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

FIGS. 8 to 13 are cross-sectional views illustrating a process of manufacturing a display apparatus according to some example embodiments.

Hereinafter, a method of manufacturing a display apparatus will be sequentially described with reference to FIGS. 8 to 13.

Referring to FIGS. 8 to 13, a method of manufacturing a display apparatus according to some example embodiments may include forming an organic light-emitting diode OLED over a substrate 100, forming a black matrix BM and a column spacer CS over the organic light-emitting diode OLED, and bonding the substrate 100 where the black matrix BM, and the column spacer CS are formed to an upper substrate 200 where a first quantum conversion layer QD1, a second quantum conversion layer QD2, and a transmission layer TW are formed.

Also, after the forming of the organic light-emitting diode OLED over the substrate 100, forming a thin-film encapsulation layer 400 on the organic light-emitting diode OLED may be further performed.

Figure 8:
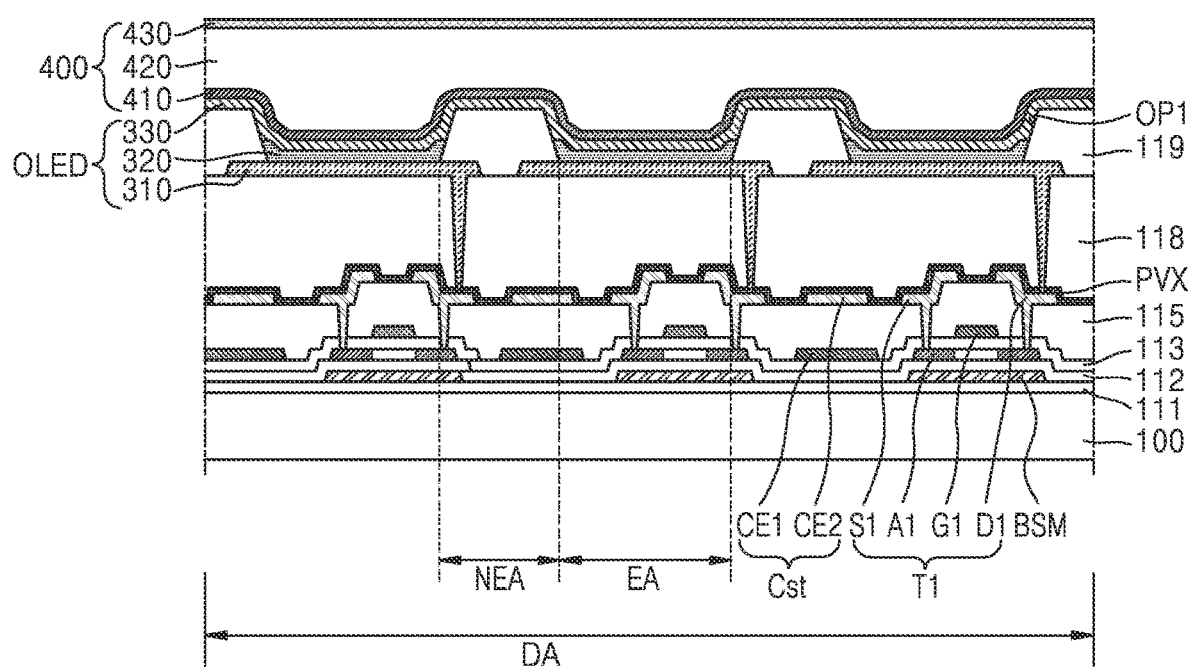
FIGS. 8 to 13 are cross-sectional views illustrating a process of manufacturing a display apparatus according to some example embodiments.

Referring to FIG. 8, a thin-film transistor T1, an organic light-emitting diode OLED, and a thin-film encapsulation layer 400 may be formed over the substrate 100.

The thin-film transistor T1 may include a semiconductor layer A1, a gate electrode G1, a source electrode S1, and a drain electrode D1. The organic light-emitting diode OLED may include a pixel electrode 310, an intermediate layer 320 formed on the pixel electrode 310, and an opposite electrode 330 formed on the intermediate layer 320.

The thin-film encapsulation layer 400 may be formed on the organic light-emitting diode OLED and may include at least one organic encapsulation layer and at least one inorganic encapsulation layer. For example, the thin-film encapsulation layer 400 may include a first inorganic encapsulation layer 410, an organic encapsulation layer 420, and a second inorganic encapsulation layer 430.

A pixel definition layer 119 in which a first opening OP1 is defined may be arranged over the substrate 100. At least a portion of the pixel electrode 310 may be exposed through the first opening OP1 defined in the pixel definition layer 119.

After the forming of the organic light-emitting diode OLED over the substrate 100, forming a black matrix BM and a column spacer over the organic light-emitting diode OLED may be further performed.

The forming of the black matrix BM and the column spacer CS on the organic light-emitting diode OLED may include forming a color material layer 450 over the organic light-emitting diode OLED, exposing a portion of the color material layer 450, forming a black matrix BM and a column spacer CS by developing the exposed color material layer, and baking the black matrix BM and the column spacers CS.

Figure 9:
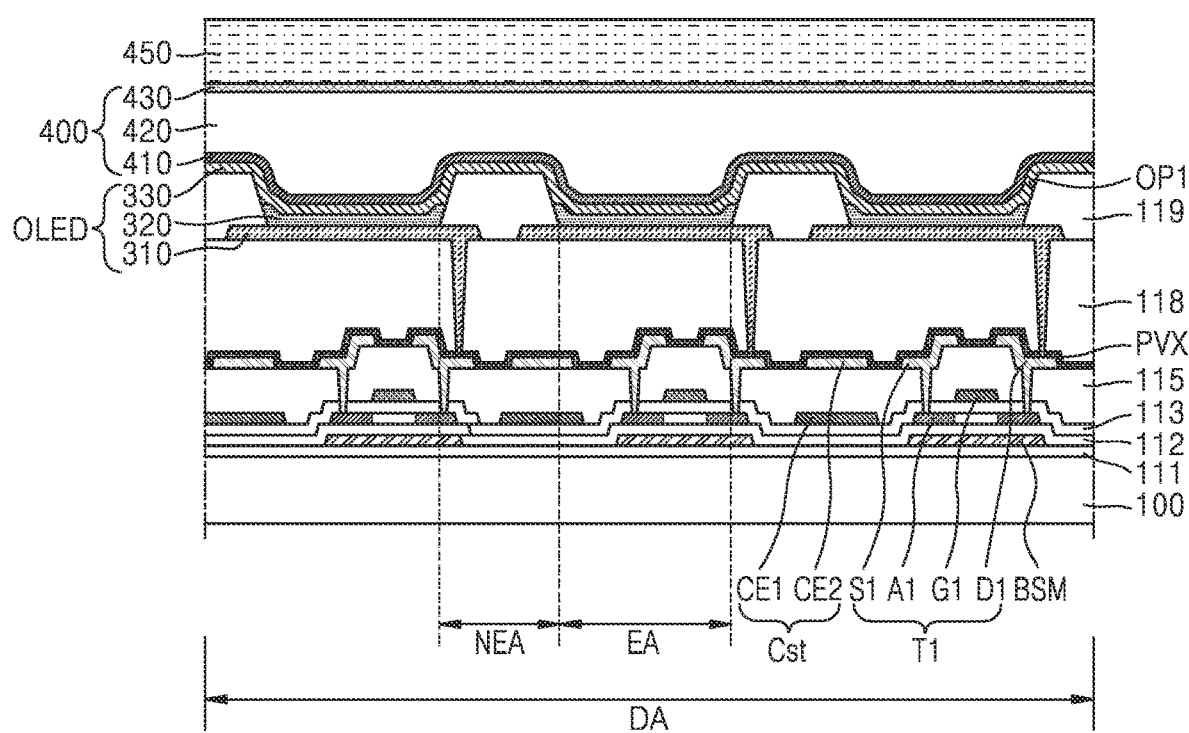

Referring to FIG. 9, after the forming of the organic light-emitting diode OLED over the substrate 100, forming a color material layer 450 over the organic light-emitting diode OLED may be further performed. More particularly, after the forming of the organic light-emitting diode OLED over the substrate 100 and the forming of the thin-film encapsulation layer 400 on the organic light-emitting diode OLED, forming a color material layer 450 on the thin-film encapsulation layer 400 may be further performed.

The color material layer 450 may be entirely applied over the substrate 100 to cover the thin-film encapsulation layer 400. The color material layer 450 may include at least one of black pigment, black dye, or black particles. Also, the color material layer 450 may include a material such as Cr, CrOx, Cr/CrOx, Cr/CrOx/CrNy, resin (e.g., carbon pigment or RGB mixed pigment), graphite, or non-Cr. According to some example embodiments, the color material layer 450 may include a negative photosensitive material. According to some example embodiments, the color material layer 450 may include a positive photosensitive material.

Figure 10:
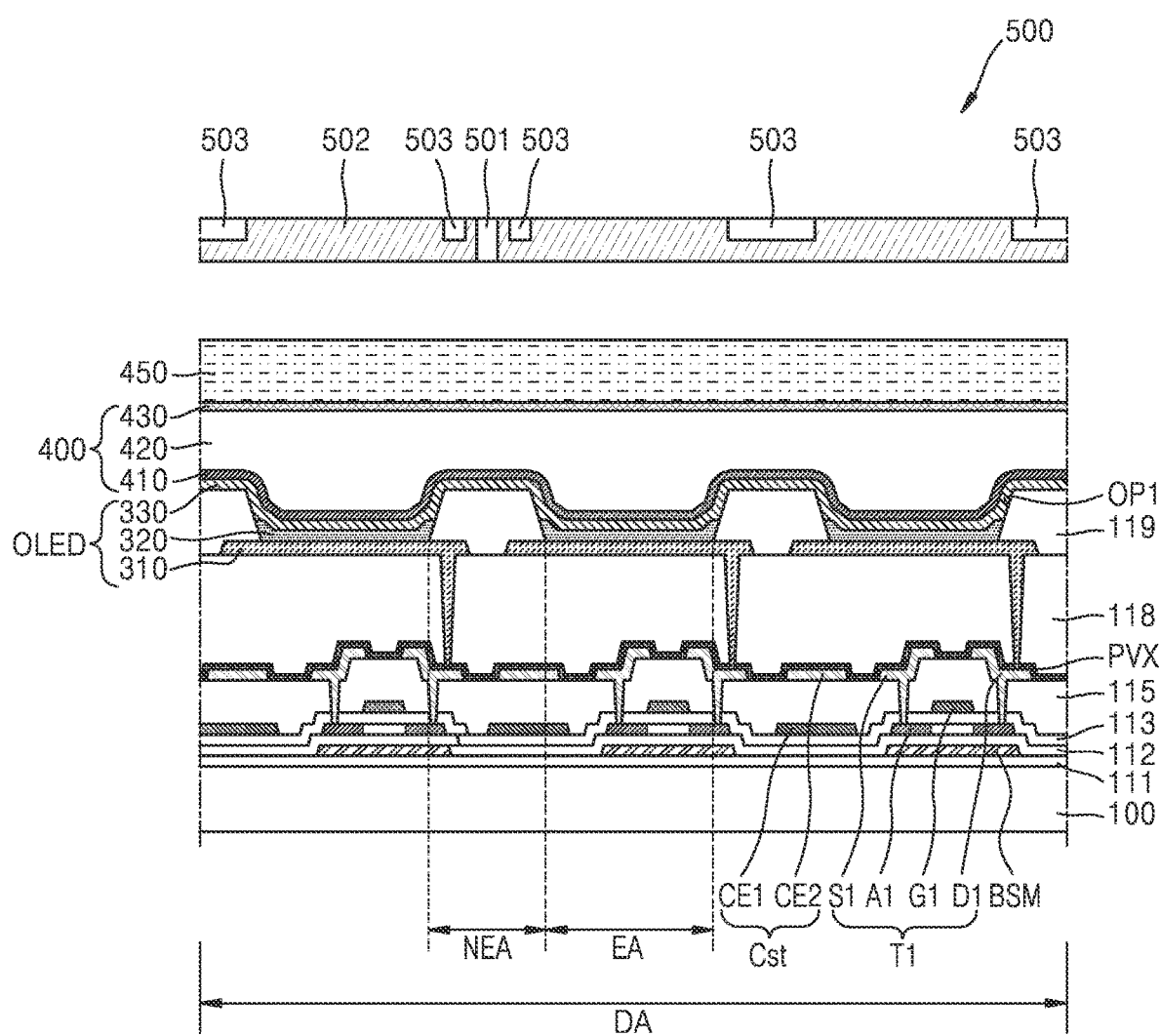

Thereafter, as illustrated in FIG. 10, after the forming of the color material layer 450 on the thin-film encapsulation layer 400, exposing a portion of the color material layer 450 by using a mask 500 including a transmission portion 501, a light blocking portion 502, and a semi-transmission portion 503 may be performed.

The mask 500 including the transmission portion 501, the light blocking portion 502, and the semi-transmission portion 503 may be a halftone mask. The transmission portion 501 of the mask 500 may transmit light of a certain wavelength band to be irradiated, and the light blocking portion 502 of the mask 500 may block light of a certain wavelength band to be irradiated, and the semi-transmission portion 503 may transmit only a portion of light of a certain wavelength band to be irradiated. For example, the transmission portion 501 of the mask 500 may have a higher transmittance than the semi-transmission portion 503 of the mask 500.

In the exposing of a portion of the color material layer 450, the transmission portion 501 of the mask 500 may transmit the irradiated light to expose the color material layer 450 corresponding to the transmission portion 501 of the mask 500, the light blocking portion 502 of the mask 500 may block the irradiated light not to expose the color material layer 450 corresponding to the light blocking portion 502 of the mask 500, and the semi-transmission portion 503 of the mask 500 may transmit only a portion of the irradiated light to expose the color material layer 450 corresponding to the semi-transmission portion 503 of the mask 500, wherein the color material layer 450 corresponding to the semi-transmission portion 503 of the mask 500 may be less exposed than the color material layer 450 corresponding to the transmission portion 501 of the mask 500.

Figure 11:
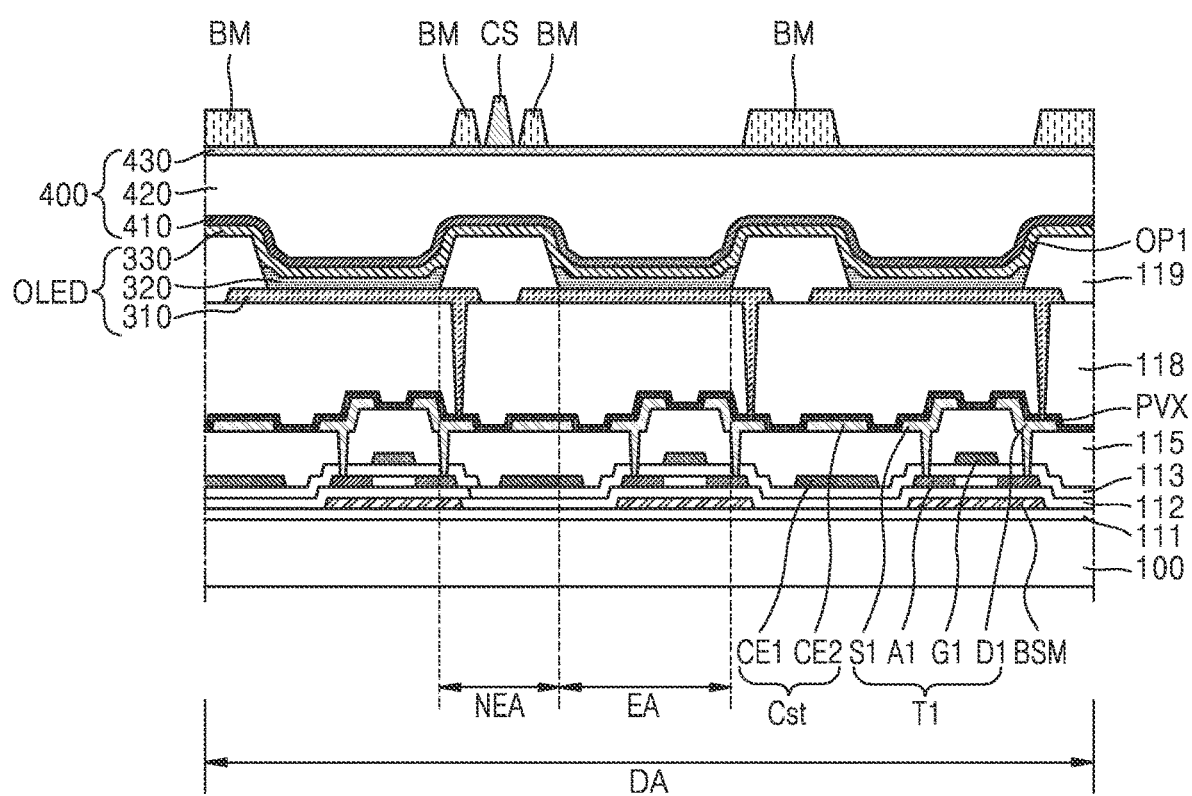

Thereafter, as illustrated in FIG. 11, after the exposing of a portion of the color material layer 450, forming a black matrix BM and a column spacer CS by developing the exposed color material layer may be further performed.

According to some example embodiments, when the color material layer 450 includes a negative photosensitive material, the color material layer 450 corresponding to the transmission portion 501 of the mask 500 may remain through a development process to form a column spacer CS, the color material layer 450 corresponding to the light blocking portion 502 of the mask 500 may be removed, and the color material layer 450 corresponding to the semi-transmission portion 503 of the mask 500 may partially remain to form a black matrix BM. However, embodiments according to the present disclosure are not limited thereto, and according to the type of the color material layer 450, the exposed portion may be removed and the unexposed portion may remain.

As described above, the transmission portion 501 of the mask 500 may have a higher transmittance than the semi-transmission portion 503 of the mask 500, and thus the column spacer CS corresponding to the transmission portion 501 of the mask 500 may be thicker than the black matrix BM corresponding to the semi-transmission portion 503 of the mask 500.

Figure 12:
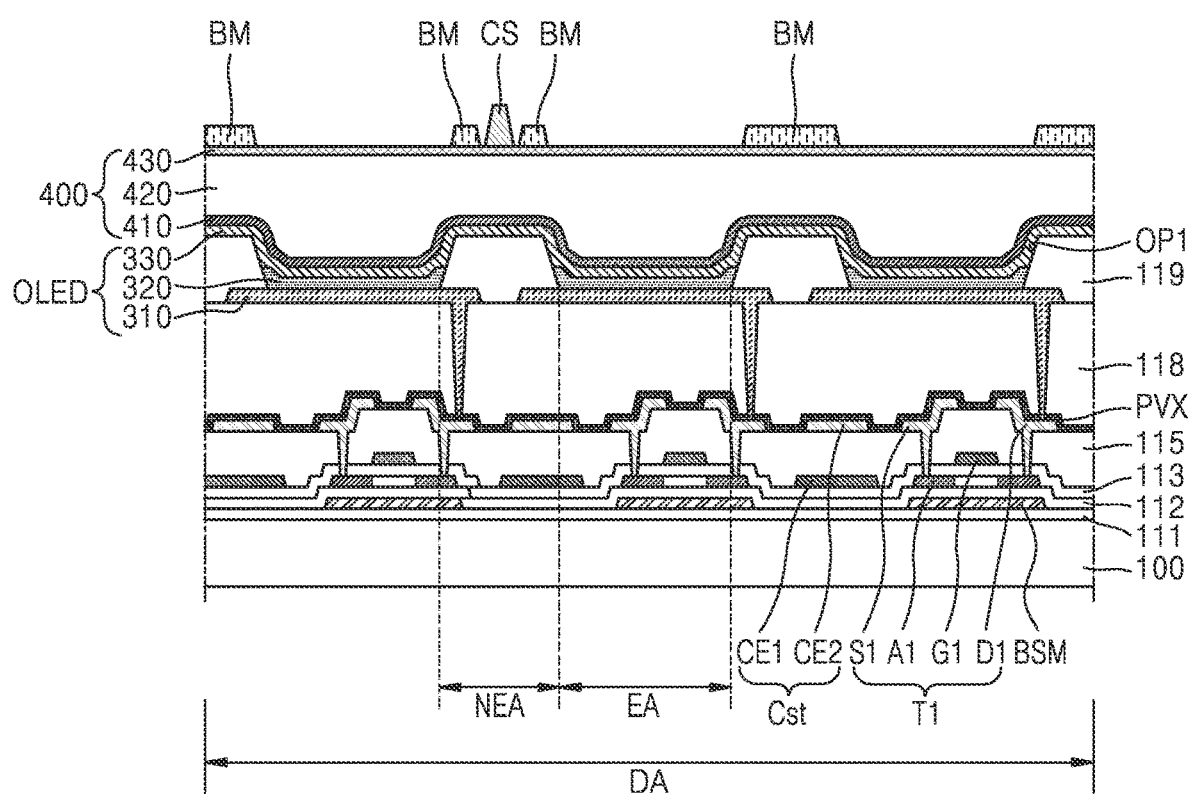

Thereafter, as illustrated in FIG. 12, after the forming of the black matrix BM and the column spacer CS by developing the exposed color material layer, baking the black matrix BM and the column spacer CS may be further performed.

When the black matrix BM and the column spacer CS are baked, the organic light-emitting diode OLED arranged over the substrate 100 may be damaged. More particularly, when the black matrix BM and the column spacer CS are baked, the organic material constituting the organic emission layer included in the organic light-emitting diode OLED may be damaged. Thus, in the baking of the black matrix BM and the column spacer CS, the baking may be performed at a temperature of about 90° C. or less.

When the black matrix BM, and the column spacer CS are baked, the thickness of the black matrix BM and the column spacer CS may decrease somewhat. Because the column spacer CS is a portion corresponding to the transmission portion 501 of the mask 500 and the black matrix BM is a portion corresponding to the semi-transmission portion 503 of the mask 500, when the black matrix BM and the column spacer CS are baked, the thickness of the black matrix BM and the column spacer CS may decrease somewhat, wherein the thickness reduction amount of the black matrix BM may be greater than the thickness reduction amount of the column spacer CS.

Figure 13:
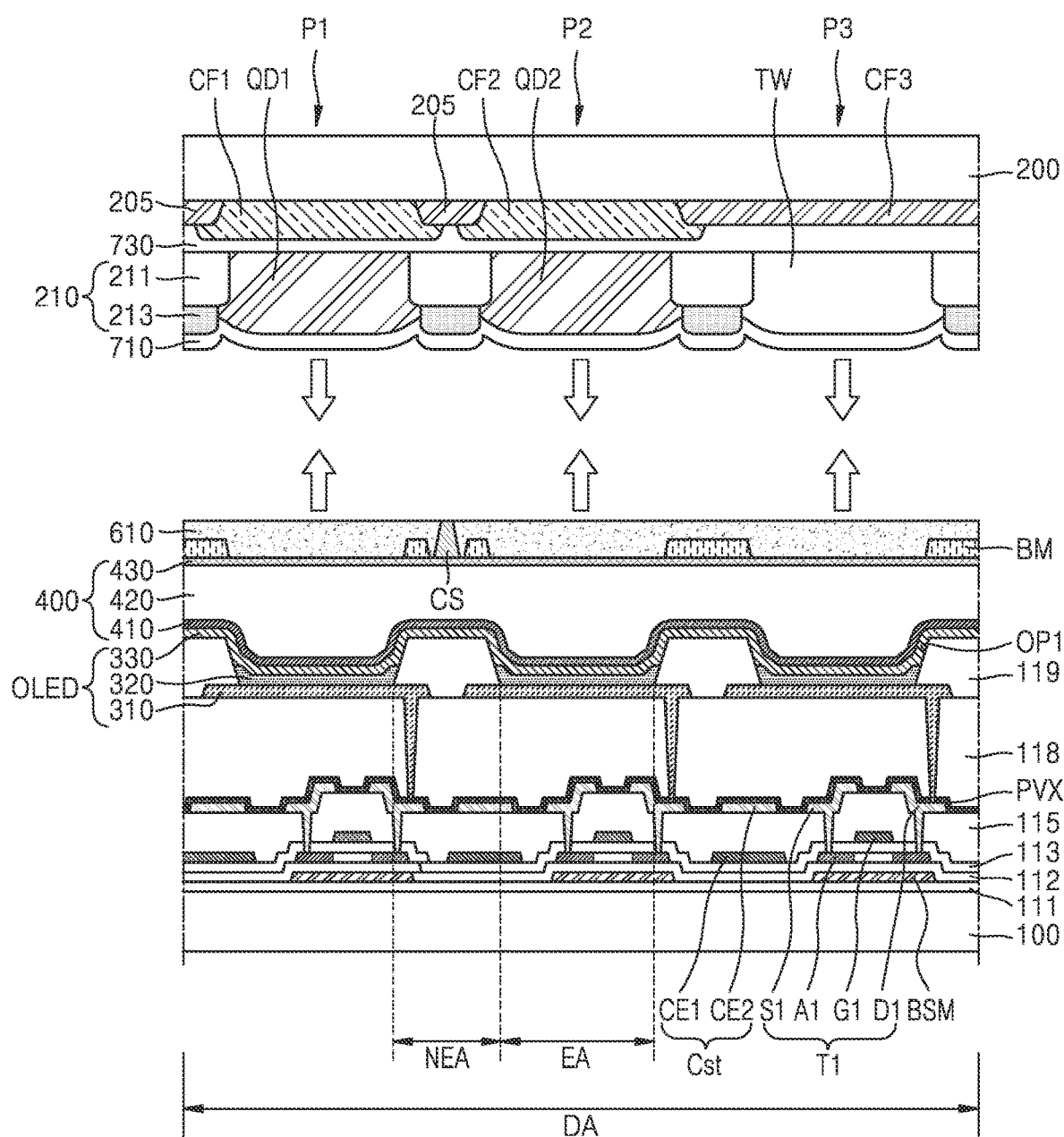

Thereafter, as illustrated in FIG. 13, after the baking of the black matrix BM and the column spacer CS, bonding the substrate 100 where the black matrix BM and the column spacer CS are formed to the upper substrate 200 where the first quantum conversion layer QD1, the second quantum conversion layer QD2, and the transmission layer TW are formed may be further performed.

A display apparatus according to some example embodiments may be manufactured by bonding the substrate 100 where the thin-film transistor T1 and the organic light-emitting diode OLED are formed to the upper substrate 200 where the quantum conversion layers QD1 and QD2 and the color filters CF1, CF2, and CF3 are formed.

Thus, after the baking of the black matrix BM and the column spacer CS, a filler 610 may be applied over the substrate 100 where the black matrix BM and the column spacer CS are formed, and then the substrate 100 where the thin-film transistor T1 and the organic light-emitting diode OLED are formed may be bonded to the upper substrate 200 where the quantum conversion layers QD1 and QD2 and the color filters CF1, CF2, and CF3 are formed. According to some example embodiments, after the applying of the filler 610 over the upper substrate 200 where the quantum conversion layers QD1 and QD2, and the color filters CF1, CF2, and CF3 are formed, the substrate 100 where the thin-film transistor T1 and the organic light-emitting diode OLED are formed may be bonded to the upper substrate 200 where the quantum conversion layers QD1 and QD2, and the color filters CF1, CF2, and CF3 are formed.

When the filler 610 includes an organic material, when the substrate 100 and the upper substrate 200 are bonded together, the cell gap between the substrate 100 and the upper substrate 200 may fall and thus the screen uniformity may degrade. Also, when the column spacer CS is integrally formed with the black matrix BM, the thickness distribution of the column spacer CS may be increased by contraction when the column spacer CS and the black matrix BM are baked. Also, when the column spacer CS is formed over the upper substrate 200, the thickness distribution of the column spacer CS may increase due to the thickness distribution of the quantum conversion layers QD1 and QD2 and the color filters CF1, CF2, and CF3.

According to some example embodiments, by arranging the column spacer CS over the substrate 100, even when the filler 610 includes an organic material, the cell gap of the substrate 100 and the upper substrate 200 may be uniformly maintained to improve the screen uniformity.

According to some example embodiments, the column spacer CS and the black matrix BM may be simultaneously formed in the same process without an additional process by using a halftone mask, and by forming the column spacer CS and the black matrix BM to be spaced apart from each other, it may be possible to prevent the thickness distribution of the column spacer CS from increasing by contraction when the column spacer CS and the black matrix BM are baked.

According to some example embodiments, by arranging the column spacer CS on the second inorganic encapsulation layer 430 having a flat top surface, the thickness distribution of the column spacer CS may be reduced.

According to some example embodiments, the black matrix BM and the column spacer CS may absorb the light emitted from the organic light-emitting diode OLED arranged thereunder or absorb the light reflected from the quantum conversion layers QD1 and QD2 and the color filters CF1, CF2, and CF3 arranged thereover, thereby making it possible to prevent, minimize, or reduce light color mixing.

As described above, because the display apparatus according to some example embodiments includes the black matrix and the column spacer arranged on the thin-film encapsulation layer, the visibility thereof may be improved and the cell gap between the substrate and the upper substrate may be relatively uniformly maintained.

It should be understood that the example embodiments described herein should be considered in a descriptive sense only and not for purposes of limitation. Descriptions of features or aspects within each embodiment should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims and their equivalents.

What is claimed is:

1. A method of manufacturing a display apparatus including a first pixel, a second pixel, and a third pixel emitting different colors, the method comprising:

forming an organic light-emitting diode on a first substrate;

forming a black matrix and a column spacer on the organic light-emitting diode; and bonding the first substrate where the black matrix and the column spacer are formed to a second substrate where a first quantum conversion layer, a second quantum conversion layer, and a transmission layer are formed, wherein the column spacer is at a same layer as the black matrix and is spaced apart from the black matrix by a first distance in a plan view.

2. The method of claim 1, further comprising, after the forming of the organic light-emitting diode on the first substrate, forming a thin-film encapsulation layer on the organic light-emitting diode.

3. The method of claim 2, wherein the black matrix and the column spacer are formed on the thin-film encapsulation layer.

4. The method of claim 3, wherein the forming of the black matrix and the column spacer comprises:

forming a color material layer on the thin-film encapsulation layer;

exposing a portion of the color material layer;

forming the black matrix and the column spacer by developing the color material layer; and baking the black matrix and the column spacer.

5. The method of claim 1, wherein the first distance is 1 μm or more.

6. The method of claim 4, wherein the column spacer has a first thickness from the thin-film encapsulation layer, and the black matrix has a second thickness from the thin-film encapsulation layer, the second thickness being smaller than the first thickness.

7. The method of claim 1, wherein the organic light-emitting diode includes a pixel electrode exposed at least partially by a pixel definition layer, an intermediate layer formed on the pixel electrode, and an opposite electrode formed on the intermediate layer, and the black matrix and the column spacer at least partially overlap the pixel definition layer.

8. The method of claim 1, wherein the first quantum conversion layer corresponds to an emission area of the first pixel and includes first quantum dots, the second quantum conversion layer corresponds to an emission area of the second pixel and includes second quantum dots, and an average size of the first quantum dots is greater than an average size of the second quantum dots.

9. The method of claim 1, wherein the display apparatus further includes:

a first color filter overlapping the first quantum conversion layer;

a second color filter overlapping the second quantum conversion layer and having a different color than the first color filter; and a third color filter overlapping the transmission layer and having a different color than the first color filter and the second color filter.

* * * * *